US012406746B2

(12) United States Patent
Imai

(10) Patent No.: US 12,406,746 B2
(45) Date of Patent: Sep. 2, 2025

(54) SEMICONDUCTOR STORAGE APPARATUS CAPABLE OF EFFICIENTLY PERFORMING SCREENING TEST

(71) Applicant: ABLIC Inc., Nagano (JP)

(72) Inventor: Yasushi Imai, Nagano (JP)

(73) Assignee: ABLIC Inc., Nagano (JP)

( * ) Notice: Subject to any disclaimer, the term of this patent is extended or adjusted under 35 U.S.C. 154(b) by 0 days.

(21) Appl. No.: 18/451,113

(22) Filed: Aug. 17, 2023

(65) Prior Publication Data

US 2024/0071551 A1 Feb. 29, 2024

(30) Foreign Application Priority Data

Aug. 30, 2022 (JP) ................... 2022-136614

(51) Int. Cl.
*G11C 29/50* (2006.01)
*G11C 29/34* (2006.01)
*G11C 16/04* (2006.01)
*G11C 29/12* (2006.01)

(52) U.S. Cl.
CPC .............. *G11C 29/50* (2013.01); *G11C 29/34* (2013.01); *G11C 16/0433* (2013.01); *G11C 2029/1204* (2013.01); *G11C 2029/5004* (2013.01)

(58) Field of Classification Search
CPC ...... G11C 16/00–0475; G11C 16/0433; G11C 29/50; G11C 29/34; G11C 2029/1204; G11C 2029/5004
See application file for complete search history.

(56) References Cited

U.S. PATENT DOCUMENTS

2013/0182509 A1* 7/2013 Lee .................... G11C 16/3459
365/185.25

FOREIGN PATENT DOCUMENTS

JP H0629364 2/1994

* cited by examiner

*Primary Examiner* — Alfredo Bermudez Lozada
(74) *Attorney, Agent, or Firm* — JCIPRNET

(57) ABSTRACT

Provided is a semiconductor storage apparatus having a storage apparatus driving circuit which can efficiently perform screening tests for the semiconductor memory device. A semiconductor memory device includes a wright-voltage supply circuit, a wright-voltage switching circuit, a bit line discharge control circuit, a bit line discharge circuit, and a memory array. The wright-voltage supply circuit is connected to the memory array through the wright-voltage switching circuit. The bit line discharge control circuit is connected to the memory array through the bit line discharge circuit.

6 Claims, 6 Drawing Sheets

SEMICONDUCTOR STORAGE APPARATUS CAPABLE OF EFFICIENTLY PERFORMING SCREENING TEST

CROSS-REFERENCE TO RELATED APPLICATION

This application claims the priority benefits of Japanese application no. 2022-136614, filed on Aug. 30, 2022. The entirety of the above-mentioned patent application is hereby incorporated by reference herein and made a part of this specification.

BACKGROUND

Technical Field

The present invention relates to a semiconductor storage apparatus.

Related Art

FLOTOX (Floating Gate Tunnel Oxide) type EEPROM semiconductor storage apparatuses may not be able to write or read correct data due to insulation defects between adjacent wirings of semiconductor elements. In order to detect the location of such insulation defects, the manufacturing process of the semiconductor storage apparatus includes a step of applying voltage stress between adjacent wirings of the semiconductor elements for inspection.

SUMMARY

Japanese Unexamined Patent Publication No. H6-29364 discloses the principle of inspection by applying voltage stress between adjacent wirings in a semiconductor storage apparatus. However, a specific circuit for generating the signal to apply the voltage stress is not disclosed. The object of the present invention is to provide a semiconductor storage apparatus having a storage cell driving circuit which can efficiently perform screening tests of the storage apparatus.

In an aspect of the present invention, a semiconductor storage apparatus includes a wright-voltage supply circuit, a wright-voltage switching circuit, a bit line discharge control circuit, a bit line discharge circuit, and a memory array. The wright-voltage supply circuit is connected to the memory array through the wright-voltage switching circuit, and the bit line discharge control circuit is connected to the memory array through the bit line discharge circuit.

The semiconductor storage apparatus of the present invention can efficiently perform screening tests of the semiconductor storage apparatus by applying voltage stress between adjacent wirings for inspection.

DESCRIPTION OF THE EMBODIMENTS

Figure 1:
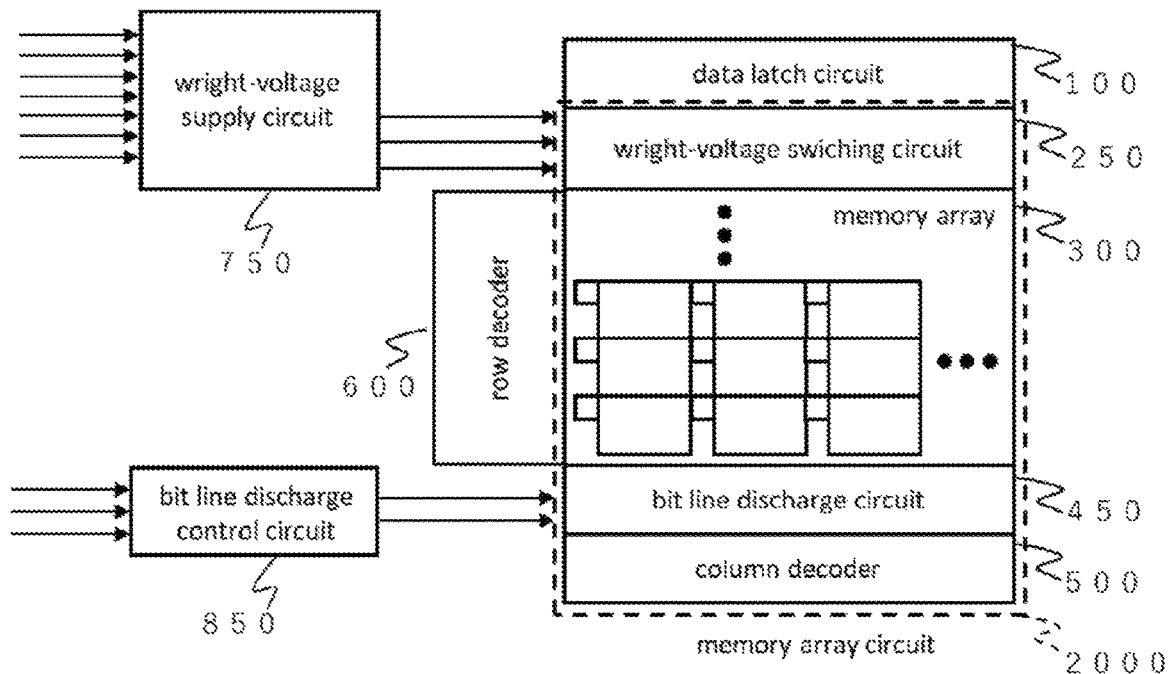
FIG. 1 is a block diagram illustrating an example of a semiconductor storage apparatus according to an embodiment of the present invention.

Referring to the drawings, an embodiment of the present invention will be described. FIG. 1 is a block diagram illustrating an example of a semiconductor storage apparatus according to the embodiment.

Referring to FIG. 1, the configuration of the semiconductor storage apparatus of the embodiment will be described. The semiconductor storage apparatus of the embodiment includes a data latch circuit 100, a wright-voltage supply circuit 750, a wright-voltage switching circuit 250, a bit line discharge control circuit 850, a bit line discharge circuit 450, a row decoder 600, a column decoder 500, and a memory array 300. The wright-voltage switching circuit 250, the memory array 300, the bit line discharge circuit 450, and the column decoder 500 constitute a memory array circuit 2000.

The connection of the semiconductor storage apparatus of the embodiment will be described. The data latch circuit 100 and the wright-voltage supply circuit 750 are connected to the memory array 300 through the wright-voltage switching circuit 250, and the bit line discharge control circuit 850 and the column decoder 500 are connected to the memory array 300 through the bit line discharge circuit 450.

Figure 2:
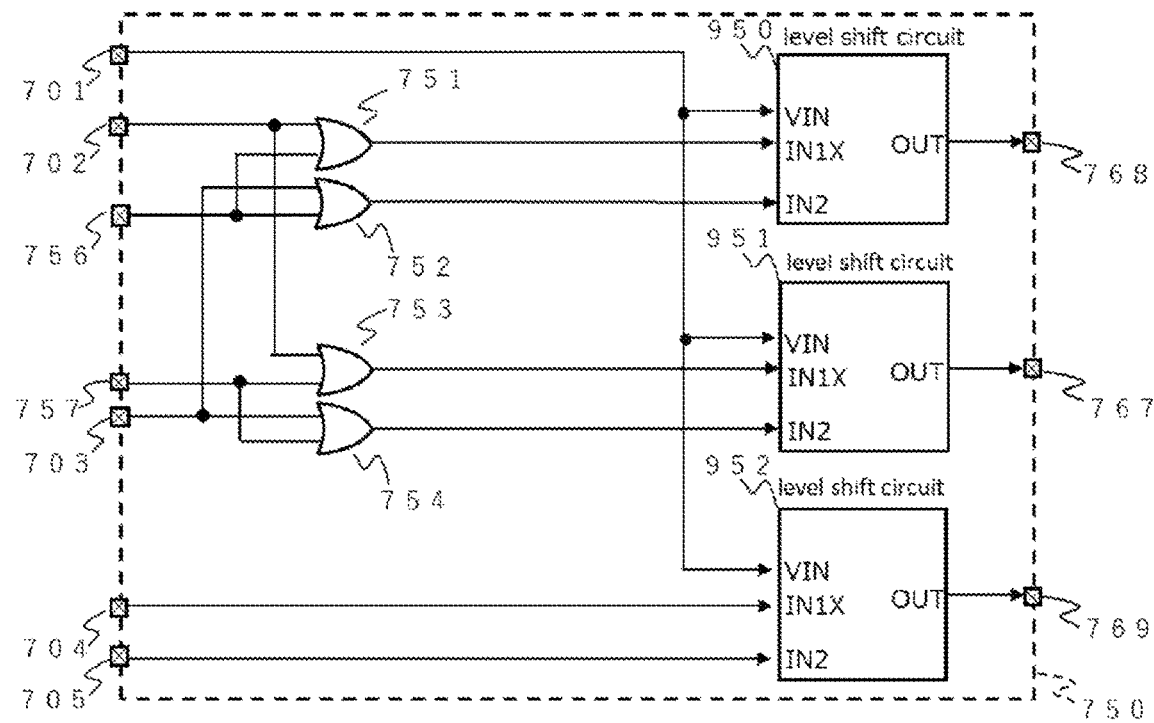
FIG. 2 is a circuit diagram illustrating an example of a wright-voltage supply circuit according to the embodiment of the present invention.

Referring to FIG. 2, the configuration of the wright-voltage supply circuit 750 of the embodiment will be described. The wright-voltage supply circuit 750 includes seven input ports, three output ports, four two-input OR circuits 751-754 from the first two-input OR circuit to the fourth two-input OR circuit, and three level shift circuits 950-952 from the first level shift circuit to the third level shift circuit. The first to third level shift circuits 950 to 952 include a power port VIN, a first input port IN1X, a second input port IN2, and an output port OUT. The seven input ports include a wright-voltage input port 701, a first erase cycle control signal input port 702, a second erase cycle control signal input port 703, a first wright-cycle control signal input port 704, a second wright-cycle control signal input port 705, an odd sense line test signal input port 756, and an even sense line test signal input port 757. The three output ports are an even sense line wright-voltage output port 767, an odd sense line wright-voltage output port 768, and a bit line wright-voltage output port 769.

The connection of the wright-voltage supply circuit 750 in the embodiment will be described. The wright-voltage input port 701 is connected to the power port VIN of the first level shift circuit 950, the power port VIN of the second level shift circuit 951, and the power port VIN of the third level shift circuit 952. The first erase cycle control signal input port 702 is connected to a first input port of the first two-input OR circuit 751 and a first input port of the third two-input OR circuit 753. The second erase cycle control signal input port 703 is connected to a first input port of the second two-input OR circuit 752 and a first input port of the fourth two-input OR circuit 754. The odd sense line test signal input port 756 is connected to a second input port of the first two-input OR circuit 751 and a second input port of the second two-input OR circuit 752. The even sense line test signal input port 757 is connected to a second input port of the third two-input OR circuit 753 and a second input port of the fourth two-input OR circuit 754.

An output port of the first two-input OR circuit 751 is connected to the first input port IN1X of the first level shift circuit 950. An output port of the second two-input OR circuit 752 is connected to the second input port IN2 of the first level shift circuit 950. An output port of the third two-input OR circuit 753 is connected to the first input port IN1X of the second level shift circuit 951. An output port of the fourth two-input OR circuit 754 is connected to a second input port IN2 of the second level shift circuit 951. The first wright-cycle control signal input port 704 is connected to the first input port IN1X of the third level shift circuit 952. The second wright-cycle control signal input port 705 is connected to a second input port IN2 of the third level shift circuit 952. In this manner, the wright-voltage supply circuit 750 of the embodiment outputs two types of voltages, odd sense line wright-voltage and even sense line wright-voltage.

An output port OUT of the first level shift circuit 950 is connected to the odd sense line wright-voltage output port 768. An output port OUT of the second level shift circuit 951 is connected to the even sense line wright-voltage output port 767. An output port OUT of the third level shift circuit 952 is connected to the bit line wright-voltage output port 769.

Figure 3:
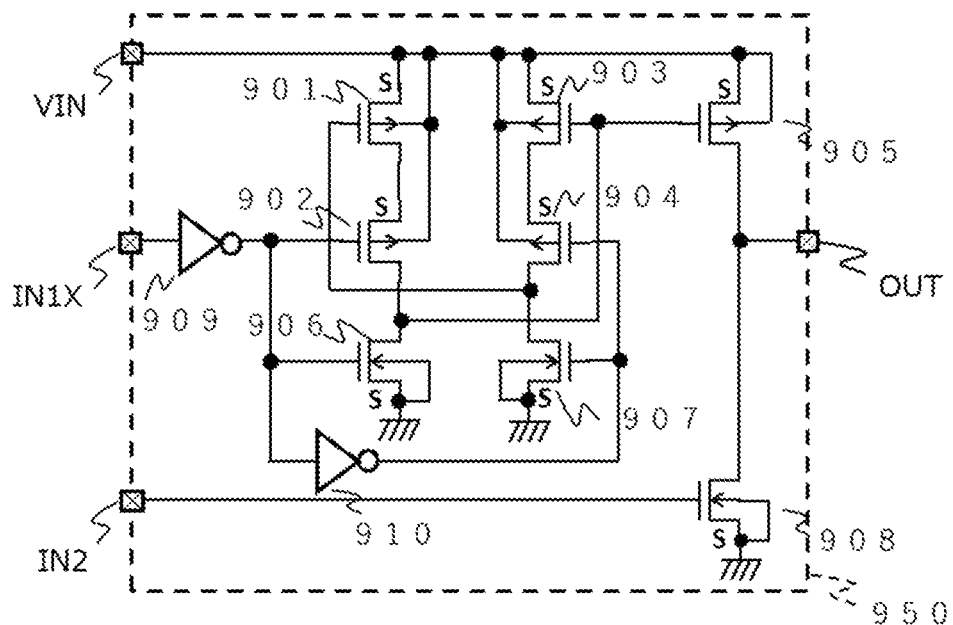
FIG. 3 is a circuit diagram illustrating an example of a memory array circuit according to the embodiment of the present invention.

Referring to FIG. 3, the configuration of the first level shift circuit 950 of the embodiment will be described. The first level shift circuit 950 includes the power port VIN, the first input port IN1X, the second input port IN2, the output port OUT, first to fifth P-channel MOS transistors (hereinafter referred to as PMOS transistors) 901 to 905, first to third N-channel MOS transistors (hereinafter referred to as NMOS transistors) 906 to 908, a first inverter 909, and a second inverter 910.

The connection of the first level shift circuit 950 of the embodiment will be described. The power port VIN is connected to a source port of the first PMOS transistor 901, a source port of the third PMOS transistor 903, and a source port of the fifth PMOS transistor 905, as well as back gate ports of the first to fifth PMOS transistors 901 to 905. The first input port IN1X is connected to a gate port of the second PMOS transistor 902 and a gate port of the first NMOS transistor 906 through the first inverter 909, and further through the second inverter 910 to the a gate port of the fourth PMOS transistor 904 and a gate port of the second NMOS transistor 907. The second input port IN2 is connected to the gate port of the third NMOS transistor 908. The source port and back gate port of the first to third NMOS transistors 906 to 908 are connected to a GND port.

A drain port of the first PMOS transistor 901 is connected to a source port of the second PMOS transistor 902. A drain port of the third PMOS transistor 903 is connected to a source port of the fourth PMOS transistor 904. A drain port of the second PMOS transistor 902 is connected to a gate port of the third PMOS transistor 903, a gate port of the fifth PMOS transistor 905, and a drain port of the first NMOS transistor 906. A drain port of the fourth PMOS transistor 904 is connected to a gate port of the first PMOS transistor 901 and a drain port of the second NMOS transistor 907. A drain port of the fifth PMOS transistor 905 is connected to a drain port of the third NMOS transistor 908 and an output port OUT. The second level shift circuit 951 and the first level shift circuit 952 have the same configuration as the first level shift circuit 950. Note that the level shift circuit may have a different circuit configuration than the level shift circuit described in the embodiment, as long as the level shift circuit has similar functions.

Figure 4:
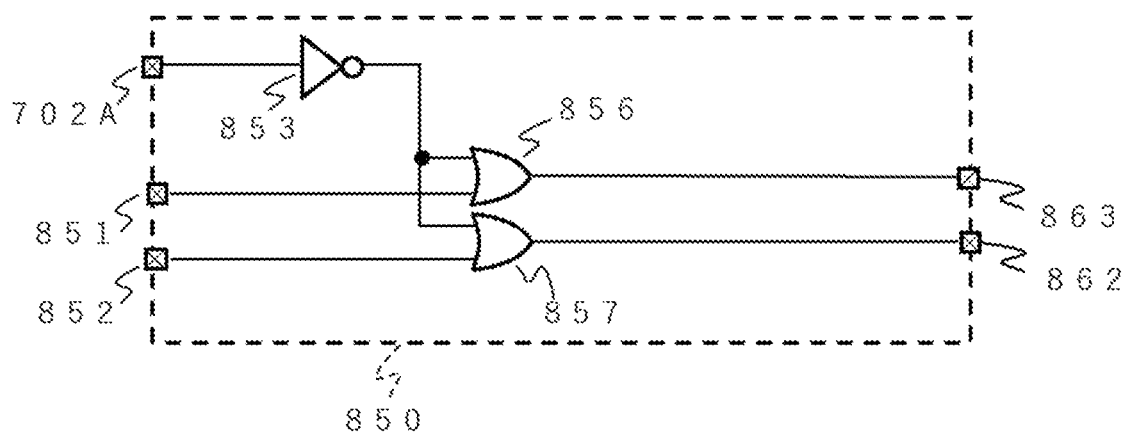
FIG. 4 is a circuit diagram illustrating an example of a bit line discharge circuit according to the embodiment of the present invention.

Referring to FIG. 4, the configuration of the bit line discharge control circuit 850 in the embodiment will be described. The bit line discharge control circuit 850 includes a first erase cycle control signal input port 702A, an odd bit line test signal input port 851, an even bit line test signal input port 852, an even bit line discharge control signal output port 862, an odd bit line discharge control signal output port 863, a seventh inverter 853, a fifth two-input OR circuit 856, and a sixth two-input OR circuit 857.

The connection of the bit line discharge control circuit 850 in the embodiment will be described. The first erase cycle control signal input port 702A is connected to a first input port of the fifth two-input OR circuit 856 and a first input port of the sixth two-input OR circuit 857 through the seventh inverter 853. The odd bit line test signal input port 851 is connected to a second input port of the fifth two-input OR circuit 856. The even bit line test signal input port 852 is connected to a second input port of the sixth two-input OR circuit 857. An output port of the fifth two-input OR circuit 856 is connected to the odd bit line discharge control signal output port 863. An output port of the sixth two-input OR circuit 857 is connected to the even bit line discharge control signal output port 862. In this manner, the bit line discharge control circuit 850 in the embodiment outputs two types of signals, an odd bit line discharge control signal and an even bit line discharge control signal.

Figure 5:
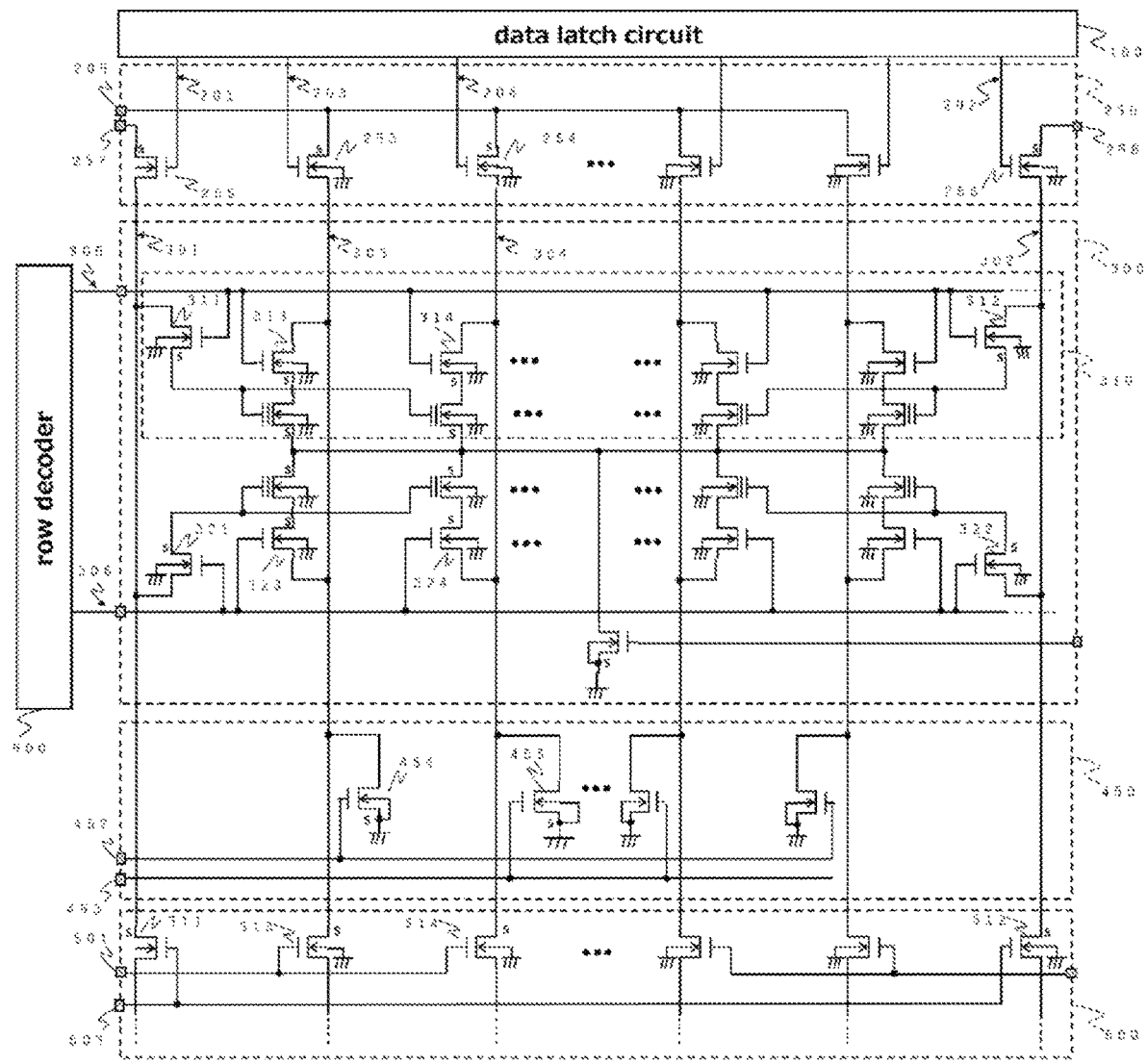
FIG. 5 is a circuit diagram illustrating an example of a memory array circuit according to the embodiment of the present invention.
Figure 6:
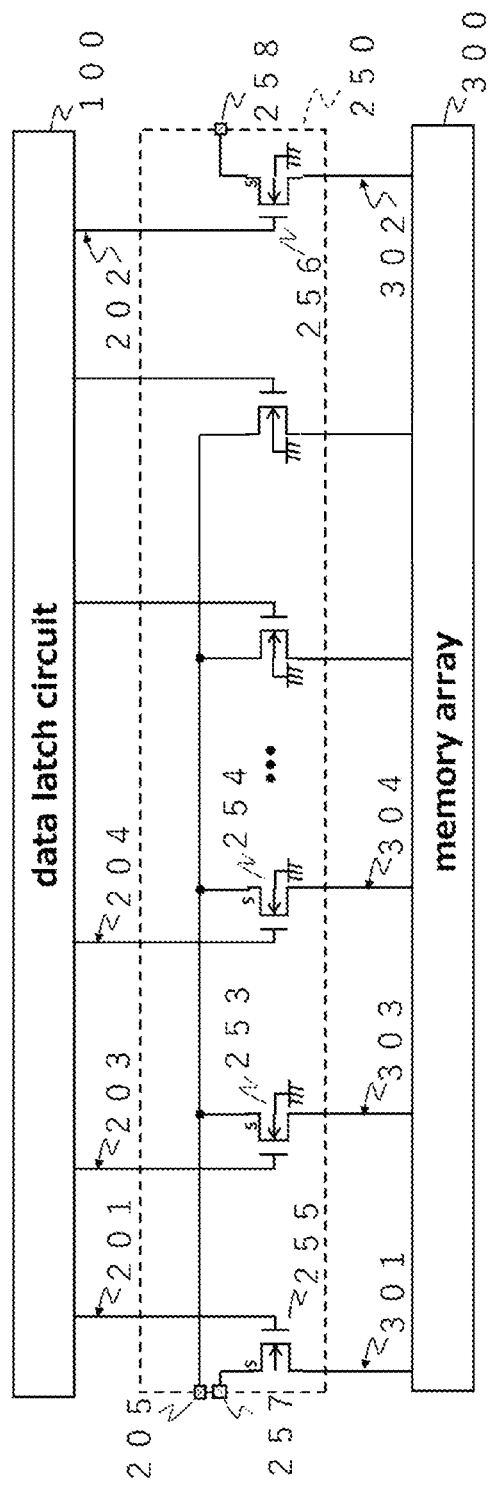
FIG. 6 is a circuit diagram illustrating an example of a wright-voltage switching circuit according to the embodiment of the present invention.
Figure 7:
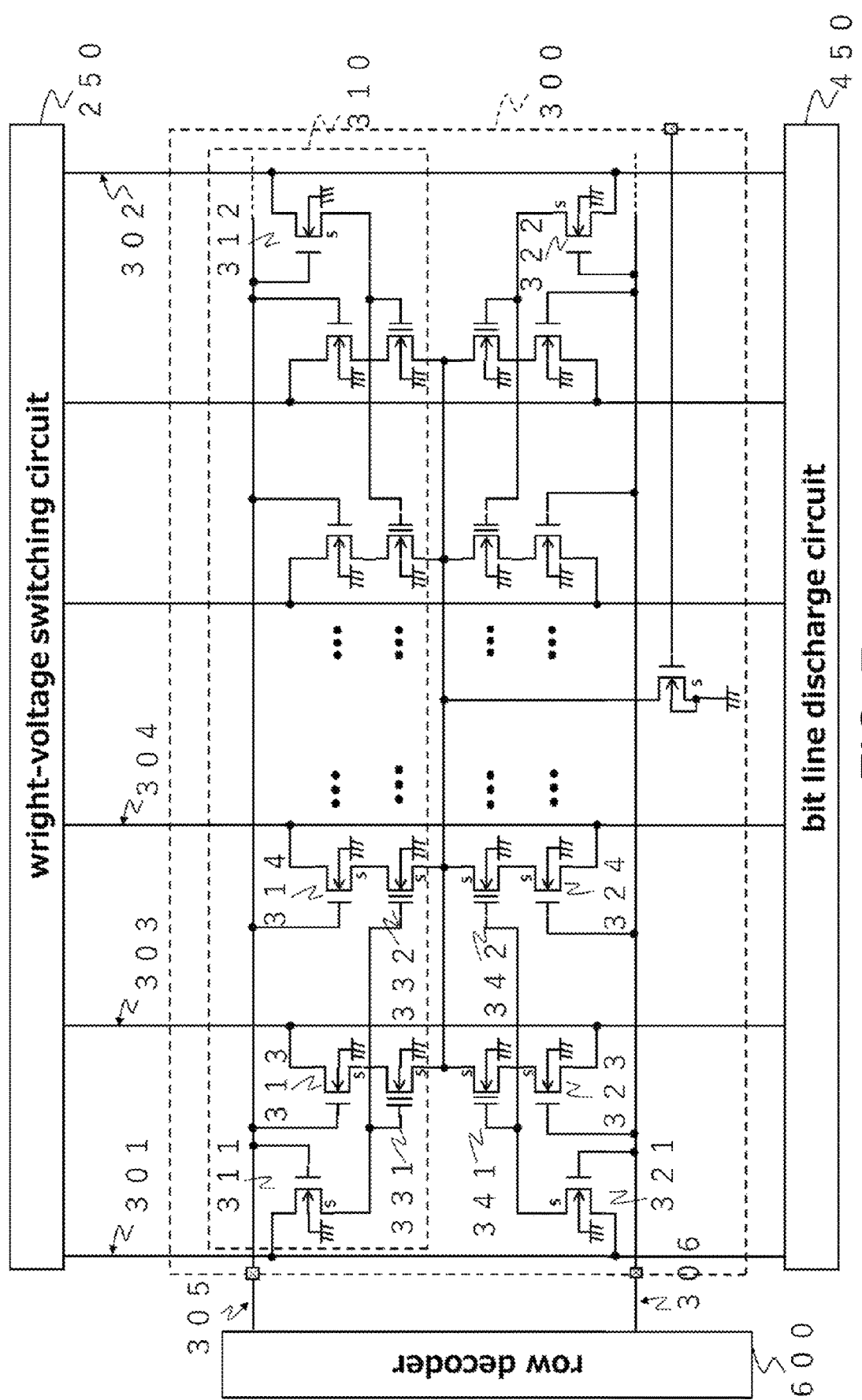
FIG. 7 is a circuit diagram illustrating an example of a memory array according to the embodiment of the present invention.
Figure 8:
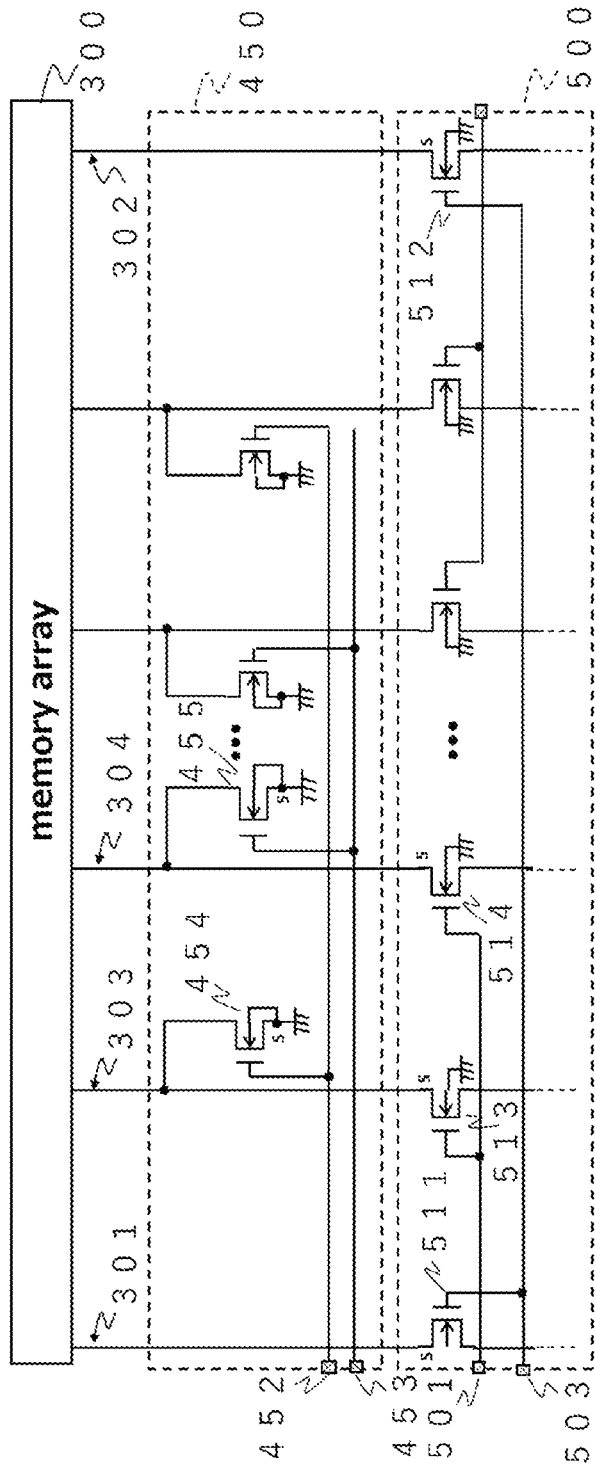
FIG. 8 is a diagram illustrating an example of a bit line discharge circuit according to the embodiment of the present invention.

Referring to FIGS. 5 to 8, the configuration of the memory array circuit 2000 in the embodiment will be described. FIG. 5 is a circuit diagram illustrating the entire memory array circuit 2000, the data latch circuit 100, and the row decoder 600. In the embodiment, an example will be described in which a region having a NMOS transistor 311 of the memory array 300 is a selected address region 310. Referring to FIGS. 6 to 8, each circuit constituting the memory array circuit 2000 will be described in detail.

Referring to FIG. 6, the configuration of the wright-voltage switching circuit 250 in the embodiment will be described. The wright-voltage switching circuit 250 of the embodiment includes a bit line wright-voltage input port 205, an even sense line wright-voltage input port 257, an odd sense line wright-voltage input port 258, and fourth to seventh NMOS transistors 253 to 256. Although there are many NMOS transistors other than the transistors illustrated in the drawing, only the transistors related to the memory elements of interest will be described here.

The connection of the wright-voltage switching circuit 250 in the embodiment will be described. The bit line wright-voltage input port 205 is connected to the bit line wright-voltage output port 769 of the wright-voltage supply circuit 750 outside the wright-voltage switching circuit 250, and is connected to a source port of the fourth NMOS transistor 253 and a source port of the fifth NMOS transistor 254 inside the wright-voltage switching circuit 250. The even sense line wright-voltage input port 257 is connected to the even sense line wright-voltage output port 767 of the wright-voltage supply circuit 750 outside the wright-voltage switching circuit 250, and is connected to a source port of the sixth NMOS transistor 255 inside the wright-voltage switching circuit 250. The odd sense line wright-voltage input port 258 is connected to the odd sense line wright-voltage output port 768 of the wright-voltage supply circuit 750 outside the wright-voltage switching circuit 250, and is connected to a source port of the seventh NMOS transistor 256 inside the wright-voltage switching circuit 250.

The sixth NMOS transistor 255 has a gate port connected to an even sense line data latch signal line 201 of the data latch circuit 100, and a drain port connected to an even sense line 301 of the selected address region 310 of the memory array 300. The seventh NMOS transistor 256 has a gate port connected to an odd sense line data latch signal line 202 of the data latch circuit 100, and a drain port connected to an odd sense line 302 of the selected address region 310 of the memory array 300. The fourth NMOS transistor 253 has a gate port connected to an even bit line data latch signal line 203 of the data latch circuit 100, and a drain port connected to an even bit line 303 of the selected address region 310 of the memory array 300. The fifth NMOS transistor 254 has a gate port connected to an odd bit line data latch signal line 204 of the data latch circuit 100, and a drain port connected to an odd bit line 304 of the selected address region 310 of the memory array 300.

Referring to FIG. 7, the configuration of the memory array 300 of the embodiment will be described. As described above, in the embodiment, the region having the NMOS transistor 311 of the memory array 300 is selected as the selected address region 310. Here, the configuration related to the selected address region 310 will be described.

The memory array 300 of the embodiment includes eighth to fifteenth NMOS transistors 311 to 314, 321 to 324, first to fourth floating gate MOS transistors (hereinafter referred to as FG-MOS transistors) 331, 332, 341, 342, the even sense line 301, the odd sense line 302, the even bit line 303, the odd bit line 304, a word 0 selection line 305, and a word 1 selection line 306. The even sense line 301 and the odd sense line 302 are arranged adjacent to each other in the memory array 300. Similarly, the even bit line 303 and the odd bit line 304 are arranged adjacent to each other in the memory array 300.

The connection of the memory array 300 of the embodiment will be described. The even sense line 301 is connected to a drain port of the eighth NMOS transistor 311 and a drain port of the twelfth NMOS transistor 321. The odd sense line 302 is connected to a drain port of the ninth NMOS transistor 312 and a drain port of the thirteenth NMOS transistor 322. The even bit line 303 is connected to the drain ports of the tenth NMOS transistor 313 and the fourteenth NMOS transistor 323. The odd bit line 304 is connected to a drain port of the eleventh NMOS transistor 314 and a drain port of the fifteenth NMOS transistor 324.

The word 0 selection line 305 is connected to a gate port of the eighth NMOS transistor 311, a gate port of the ninth NMOS transistor 312, a gate port of the tenth NMOS transistor 313, and a gate port of the eleventh NMOS transistor 314. The word 1 selection line 306 is connected to a gate port of the twelfth NMOS transistor 321, a gate port of the thirteenth NMOS transistor 322, the fourteenth NMOS transistor 323, and a gate port of the fifteenth NMOS transistor 324.

A source port of the eighth NMOS transistor 311 is connected to a gate port of the first FG-MOS transistor 331 and a gate port of the second FG-MOS transistor 332. A source port of the tenth NMOS transistor 313 is connected to the drain port of the first FG-MOS transistor 331. A source port of the eleventh NMOS transistor 314 is connected to a drain port of the second FG-MOS transistor 332. A source port of the twelfth NMOS transistor 321 is connected to a gate port of the third FG-MOS transistor 341 and a gate port of the fourth FG-MOS transistor 342. A source port of the fourteenth NMOS transistor 323 is connected to the drain port of the third FG-MOS transistor 341. A source port of the fifteenth NMOS transistor 324 is connected to a drain port of the fourth FG-MOS transistor 342.

Referring to FIG. 8, the configuration of the bit line discharge circuit 450 of the embodiment will be described. The bit line discharge circuit 450 of the embodiment includes an even bit line discharge control signal input port 452, an odd bit line discharge control signal input port 453, a sixteenth NMOS transistor 454, and a seventeenth NMOS transistor 455. Although there are many NMOS transistors other than those illustrated in the drawing, only the transistors related to the memory elements of interest will be described here.

The connection of the bit line discharge circuit 450 of the embodiment will be described. The even bit line discharge control signal input port 452 is connected to the even bit line discharge control signal output port 862 of the bit line discharge control circuit 850 outside the bit line discharge circuit 450, and is connected to a gate port of the sixteenth NMOS transistor 454 inside the bit line discharge circuit 450. The odd bit line discharge control signal input port 453 is connected to the odd bit line discharge control signal output port 863 of the bit line discharge control circuit 850 outside the bit line discharge circuit 450, and is connected to a gate port of the seventeenth NMOS transistor 455 inside the bit line discharge circuit 450.

A drain port of the sixteenth NMOS transistor 454 is connected to the even bit line 303 of the memory array 300. A drain port of the seventeenth NMOS transistor 455 is connected to the odd bit line 304 of the memory array 300. A source port of the sixteenth NMOS transistor 454 and a source port of the seventeenth NMOS transistor 455 are connected to a GND port.

Referring to FIG. 8, the configuration of the column decoder 500 of the embodiment will be described. The column decoder 500 of the embodiment includes a column 0 selection signal input port 501, a sense line bias signal input port 503, and eighteenth to twenty-first NMOS transistors 511 to 514. Although there are many NMOS transistors other than those illustrated in the drawing, only the transistors related to the memory elements of interest will be described here.

The connections of the column decoder 500 of the embodiment will be described. The eighteenth NMOS transistor 511 has a gate port connected to a sense line bias signal input port 503, and a source port connected to the even sense line 301 of the memory array 300. The nineteenth NMOS transistor 512 has a gate port connected to the sense line bias signal input port 503, and a source port connected to the odd sense line 302 of the memory array 300. The twentieth NMOS transistor 513 has a gate port connected to the column 0 selection signal input port 501, and a source port connected to the even bit line 303 of the memory array 300. The gate port of the twenty-first NMOS transistor 514 is connected to the column 0 selection signal input port 501, and the source port is connected to the odd bit line 304 of the memory array 300.

[Operation of Odd Sense Line Screening Test]

The operation of the odd sense line screening test of the semiconductor storage apparatus of the embodiment will be described. The odd sense line screening test of the semiconductor storage apparatus of the embodiment is performed in an erase cycle. From the wright-voltage supply circuit 750, the wright-voltage input port 701 receives a voltage VPP;

the first erase cycle control signal input port 702, the second erase cycle control signal input port 703, and the even sense line test signal input port 757 receive low-level signals; and the first wright-cycle control signal input port 704, the second wright-cycle control signal input port 705, and the odd sense line test signal input port 756 receives high-level signals. The wright-voltage supply circuit 750 outputs the voltage VPP from the even sense line wright-voltage output port 767, and outputs 0V (=GND voltage) from the odd sense line wright-voltage output port 768 and the bit line wright-voltage output port 769. Here, the voltage VPP is a high voltage required for performing erase and write operations on EEPROM.

From the bit line discharge control circuit 850, the first erase cycle control signal input port 702 receives a low-level voltage input, and regardless of the input voltages at the odd bit line test signal input port 851 and the even bit line test signal input port 852, high-level voltages are output from the even bit line discharge control signal output port 862 and the odd bit line discharge control signal output port 863. The bit line discharge circuit 450 receives signals from the bit line discharge control circuit 850, and the sixteenth NMOS transistor 454 and the seventeenth NMOS transistor 455 are turned on.

The data latch circuit 100 outputs the voltage VPP to the even sense line data latch signal line 201 and the odd sense line data latch signal line 202. The wright-voltage switching circuit 250 is supplied with the voltage VPP from the bit line wright-voltage output port 769 of the wright-voltage supply circuit 750 at the bit line wright-voltage input port 205, supplied with the voltage VPP from the even sense line wright-voltage output port 767 of the wright-voltage supply circuit 750 at the even sense line wright-voltage input port 257, and supplied with 0V from the odd sense line wright-voltage output port 768 of the wright-voltage supply circuit 750 at the odd sense line wright-voltage input port 258. In the wright-voltage switching circuit 250, the sixteenth NMOS transistor 255 and the seventh NMOS transistor 256 are turned on, the voltage VPP is output to the even sense line 301, and 0V is output to the odd sense line 302.

Between adjacent even sense line 301 and odd sense line 302 of the memory array 300, a voltage difference (voltage VPP−0V) is generated. The odd sense line screening test may generate voltage stress to detect defects caused by adjacent sense line failures in advance.

[Operation of the Even Sense Line Screening Test]

The operation of the even sense line screening test of the semiconductor storage apparatus according to the embodiment will be described. The even sense line screening test of the semiconductor storage apparatus of the embodiment is performed in an erase cycle. From the wright-voltage supply circuit 750, the wright-voltage input port 701 receives the voltage VPP input; the first erase cycle control signal input port 702, the second erase cycle control signal input port 703, and the odd sense line test signal input port 756 receive low-level signals; and the first wright-cycle control signal input port 704, the second wright-cycle control signal input port 705, and the even sense line test signal input port 757 receive high-level signals are output. The wright-voltage supply circuit 750 outputs the voltage VPP from the odd sense line wright-voltage output port 768, and outputs 0V from the even sense line wright-voltage output port 767 and the bit line wright-voltage output port 769.

From the bit line discharge control circuit 850, the first erase cycle control signal input port 702 receives a low-level voltage input, and regardless of the input voltages at the odd bit line test signal input port 851 and the even bit line test signal input port 852, high-level voltages are output from the even bit line discharge control signal output port 862 and the odd bit line discharge control signal output port 863. The bit line discharge circuit 450 receives signals from the bit line discharge control circuit 850, and the sixteenth NMOS transistor 454 and the seventeenth NMOS transistor 455 are turned on.

The data latch circuit 100 outputs the voltage VPP to the even sense line data latch signal line 201 and the odd sense line data latch signal line 202. The wright-voltage switching circuit 250 is supplied with 0V from the bit line wright-voltage output port 769 of the wright-voltage supply circuit 750 at the bit line wright-voltage input port 205, supplied with 0V from the even sense line wright-voltage output port 767 of the wright-voltage supply circuit 750 at the even sense line wright-voltage input port 257, and supplied with the voltage VPP from the odd sense line wright-voltage output port 768 of the wright-voltage supply circuit 750 at the odd sense line wright-voltage input port 258. In the wright-voltage switching circuit 250, the sixth NMOS transistor 255 and the seventh NMOS transistor 256 are turned on, 0V is output to the even sense line 301, and the voltage VPP is output to the odd sense line 302.

Between the adjacent even sense line 301 and odd sense line 302 of the memory array 300, a voltage difference (0V−voltage VPP) is generated. The even sense line screening test may generate voltage stress to detect defects caused by adjacent sense line failures in advance.

[Operation of Odd Bit Line Screening Test]

An operation of an odd bit line screening test of a semiconductor storage apparatus according to the embodiment will be described. The odd bit line screening test of the semiconductor storage apparatus of the embodiment is performed in a wright-cycle. From the wright-voltage supply circuit 750, the wright-voltage input port 701 receives the voltage VPP; the first erase cycle control signal input port 702 and the second erase cycle control signal input port 703 receive high-level signals; and the first wright-cycle control signal input port 704, the second wright-cycle control signal input port 705, the odd sense line test signal input port 756, and the even sense line test signal input port 757 receive low-level signals. The wright-voltage supply circuit 750 outputs 0V from the even sense line wright-voltage output port 767 and the odd sense line wright-voltage output port 768, and outputs the voltage VPP from the bit line wright-voltage output port 769.

In the bit line discharge control circuit 850, the first erase cycle control signal input port 702 and the odd bit line test signal input port 851 receive high-level voltages, and the even bit line test signal input port 852 receives a low-level voltage. The bit line discharge control circuit 850 outputs a low-level voltage from the even bit line discharge control signal output port 862 and outputs a high-level voltage from the odd bit line discharge control signal output port 863. The bit line discharge circuit 450 receives signals from the bit line discharge control circuit 850, the sixteenth NMOS transistor 454 is turned off, and the seventeenth NMOS transistor 455 is turned on.

The data latch circuit 100 outputs the voltage VPP to the even bit line data latch signal line 203 and the odd bit line data latch signal line 204 in the case of write data of the EEPROM being 0, and outputs 0V in the case of the write data of the EEPROM being 1. The wright-voltage switching circuit 250 is supplied with the voltage VPP from the bit line wright-voltage output port 769 of the wright-voltage supply circuit 750 at the bit line wright-voltage input port 205, supplied with 0V from the even sense line wright-voltage output port 767 of the wright-voltage supply circuit 750 at the even sense line wright-voltage input port 257, and supplied with 0V from the odd sense line wright-voltage output port 768 of the wright-voltage supply circuit 750 at the odd sense line wright-voltage input port 258.

The write data of the EEPROM for the even bit line data latch signal line 203 is set to 0, and the write data of the EEPROM for the odd bit line data latch signal line 204 is set to 1. In the wright-voltage switching circuit 250, the fourth NMOS transistor 253 is turned on and the voltage VPP is output to the even bit line 303, and the fifth NMOS transistor 254 is turned off and 0V is output to the odd bit line 304.

Between adjacent even bit line 303 and odd bit line 304 of the memory array 300, a voltage difference (voltage VPP−0V) is generated. The odd bit line screening test may generate voltage stress for detecting defects caused by adjacent bit line failures in advance.

By setting the write data of the EEPROM for the even bit line data latch signal line 203 to 1, and the write data of the EEPROM for the odd bit line data latch signal line 204 to 0, a similar potential difference (0V−voltage VPP) may be generated.

[Normal Write Operation]

The normal write operation of the semiconductor storage apparatus according to the embodiment will be described. In a wright-cycle, from the wright-voltage supply circuit 750, the wright-voltage input port 701 receives the voltage VPP; the first erase cycle control signal input port 702 and the second erase cycle control signal input port 703 receive high-level signals; and the first wright-cycle control signal input port 704, the second wright-cycle control signal input port 705, the odd sense line test signal input port 756, and the even sense line test signal input port 757 receive low-level signals. In the wright-cycle, the wright-voltage supply circuit 750 outputs 0V from the even sense line wright-voltage output port 767 and the odd sense line wright-voltage output port 768, and outputs the voltage VPP from the bit line wright-voltage output port 769.

In the wright-cycle, from the bit line discharge control circuit 850, the first erase cycle control signal input port 702 receives high-level signals, and the odd bit line test signal input port 851 and the even bit line test signal input port 852 receive low-level voltage inputs. In the wright-cycle, the bit line discharge control circuit 850 outputs low-level signals from the even bit line discharge control signal output port 862 and the odd bit line discharge control signal output port 863. The bit line discharge circuit 450 receives signals from the bit line discharge control circuit 850, and in the wright-cycle, the sixteenth NMOS transistor 454 and the seventeenth NMOS transistor 455 are turned off.

The data latch circuit 100 outputs the voltage VPP to the even sense line data latch signal line 201 in the wright-cycle in the case of the even sense line data latch signal line 201 being selected as the address, and at the same time, the odd sense line data latch signal line 202 becomes a non-selected address, and 0V is output to the odd sense line data latch signal line 202 in the wright-cycle. In the case of the write data of even bits in EEPROM being 0 and the write data of odd bits being 1, the voltage VPP is output to the even bit line data latch signal line 203, and 0V is output to the odd bit line data latch signal line 204.

In the wright-cycle, the wright-voltage switching circuit 250 is supplied with the voltage VPP from the bit line wright-voltage output port 769 of the wright-voltage supply circuit 750 at the bit line wright-voltage input port 205, supplied with 0V from the even sense line wright-voltage output port 767 of the wright-voltage supply circuit 750 at the even sense line wright-voltage input port 257, and supplied with 0V from the odd sense line wright-voltage output port 768 of the wright-voltage supply circuit 750 at the odd sense line wright-voltage input port 258. In the wright-voltage switching circuit 250, the fourth NMOS transistor 253 and the sixth NMOS transistor 255 are turned on, the voltage VPP is output to the even bit line 303 and 0V to the even sense line 301, the fifth NMOS transistor 254 and the seventh NMOS transistor 256 are turned off, and the odd bit line 304 and the odd sense line 302 are brought into a high impedance state.

In the memory array 300, the adjacent even sense line 301 and odd sense line 302 have one at 0V and the other in a high impedance state, while the adjacent even bit line 303 and the odd bit line 304 have one at the voltage VPP and the other in a high impedance state. There is no voltage applied between adjacent lines, and leakage of voltage between the lines can be suppressed. Note that in the case of the write data for even bits of EEPROM being 1 and the write data for odd bits being 0, the voltage states of the even bit line 303 and the odd bit line 304 are reversed, but similar effects can be obtained.

[Normal Erase Operation]

The normal erase operation of the semiconductor storage apparatus according to the embodiment will be described. In the erase cycle, from the wright-voltage supply circuit 750, the wright-voltage input port 701 receives the voltage VPP; the first erase cycle control signal input port 702, the second erase cycle control signal input port 703, the odd sense line test signal input port 756, and the even sense line test signal input port 757 receive low-level signals; and the first wright-cycle control signal input port 704 and the second wright-cycle control signal input port 705 receive high-level signals. In the erase cycle, the wright-voltage supply circuit 750 outputs the voltage VPP from the even sense line wright-voltage output port 767 and the odd sense line wright-voltage output port 768, and outputs 0V from the bit line wright-voltage output port 769.

In the erase cycle, from the bit line discharge control circuit 850, the first erase cycle control signal input port 702, the odd bit line test signal input port 851, and the even bit line test signal input port 852 receive low-level voltage inputs. In the erase cycle, the bit line discharge control circuit 850 outputs high-level signals from the even bit line discharge control signal output port 862 and the odd bit line discharge control signal output port 863. The bit line discharge circuit 450 receives signals from the bit line discharge control circuit 850, and in the erase cycle, the sixteenth NMOS transistor 454 and the seventeenth NMOS transistor 455 are turned on.

In the erase cycle, the data latch circuit 100 outputs the voltage VPP to the even sense line data latch signal line 201 in the case of the even sense line data latch signal line 201 being selected as the address, and at the same time, the odd sense line data latch signal line 202 becomes a non-selected address, and 0V is output to the odd sense line data latch signal line 202, and the voltage VPP is further output to the even bit line data latch signal line 203 and the odd bit line data latch signal line 204.

In the erase cycle, the wright-voltage switching circuit 250 is supplied with 0V from the bit line wright-voltage output port 769 of the wright-voltage supply circuit 750 at the bit line wright-voltage input port 205, supplied with the voltage VPP from the even sense line wright-voltage output port 767 of the wright-voltage supply circuit 750 at the even sense line wright-voltage input port 257, and supplied with the voltage VPP from the odd sense line wright-voltage output port 768 of the wright-voltage supply circuit 750 at the odd sense line wright-voltage input port 258. In the wright-voltage switching circuit 250, the fourth NMOS transistor 253, a fifth NMOS transistor 254, and the sixth NMOS transistor 255 are turned on, 0V is output to both the even bit line 303 and the odd bit line 304, the voltage VPP is output to the even sense line 301, the seventh NMOS transistor 256 is turned off, and the odd sense line 302 is brought into a high impedance state.

In the memory array 300, the adjacent even sense line 301 and odd sense line 302 have one at the voltage VPP and the other in a high impedance state, while the adjacent even bit line 303 and odd bit line 304 are both at 0V. No voltage is applied between the adjacent lines, and the voltage leak between the lines can be suppressed.

As described above, the semiconductor storage apparatus of the present invention can efficiently perform screening tests on semiconductor storage apparatuses by applying voltage stress between adjacent wires. Also, the semiconductor storage apparatus of the present invention may operate without applying voltage between adjacent wires during normal use, and can suppress leakage of the applied voltage. Although the semiconductor storage apparatus of the present invention has been described with examples of odd and even numbers, similar effects can be obtained with three or more types of signal examples.

What is claimed is:

1. A semiconductor storage apparatus, comprising:
   a wright-voltage switching circuit;
   a memory array;
   a wright-voltage supply circuit connected to the memory array through the wright-voltage switching circuit;
   a bit line discharge circuit; and
   a bit line discharge control circuit connected to the memory array through the bit line discharge circuit, wherein the wright-voltage supply circuit supplies at least two types of sense line wright-voltages to the wright-voltage switching circuit,
   wherein the wright-voltage switching circuit individually supplies voltages to at least two groups of sense lines in the memory array,
   wherein the bit line discharge control circuit outputs at least two types of bit line discharge control signals to the bit line discharge circuit, and
   wherein the bit line discharge circuit individually supplies discharge voltages to at least two groups of bit lines in the memory array.

2. The semiconductor storage apparatus according to claim 1,
   wherein the wright-voltage supply circuit comprises a wright-voltage input port, a first erase cycle control signal input port, a second erase cycle control signal input port, a first wright-cycle control signal input port, a second wright-cycle control signal input port, an odd sense line test signal input port, an even sense line test signal input port, an odd sense line wright-voltage output port, an even sense line wright-voltage output port, a bit line wright-voltage output port, first to fourth OR circuits, and first to third level shift circuits, wherein
   the wright-voltage input port is each connected to the first to third level shift circuits,
   the first OR circuit is connected to the first erase cycle control signal input port, the odd sense line test signal input port, and the first level shift circuit,
   the second OR circuit is connected to the second erase cycle control signal input port, the odd sense line test signal input port, and the first level shift circuit,
   the third OR circuit is connected to the first erase cycle control signal input port, the even sense line test signal input port, and the second level shift circuit,
   the fourth OR circuit is connected to the second erase cycle control signal input port, the even sense line test signal input port, and the second level shift circuit,
   the odd sense line wright-voltage output port is connected to the first level shift circuit,
   the even sense line wright-voltage output port is connected to the second level shift circuit, and
   the bit line wright-voltage output port is connected to the third level shift circuit.

3. The semiconductor storage apparatus according to claim 1,
   wherein the wright-voltage supply circuit comprises a wright-voltage input port, a first erase cycle control signal input port, a second erase cycle control signal input port, a first wright-cycle control signal input port, a second wright-cycle control signal input port, an odd sense line test signal input port, an even sense line test signal input port, an odd sense line wright-voltage output port, an even sense line wright-voltage output port, a bit line wright-voltage output port, first to fourth OR circuits, and first to third level shift circuits, wherein
   the wright-voltage input port is connected to the first to third level shift circuits,
   the first OR circuit is connected to the first erase cycle control signal input port, the odd sense line test signal input port, and the first level shift circuit,
   the second OR circuit is connected to the second erase cycle control signal input port, the odd sense line test signal input port, and the first level shift circuit,
   the third OR circuit is connected to the first erase cycle control signal input port, the even sense line test signal input port, and the second level shift circuit,
   the fourth OR circuit is connected to the second erase cycle control signal input port, the even sense line test signal input port, and the second level shift circuit,
   the odd sense line wright-voltage output port is connected to the first level shift circuit;
   the even sense line wright-voltage output port is connected to the second level shift circuit, and
   the bit line wright-voltage output port is connected to the third level shift circuit.

4. The semiconductor storage apparatus according to claim 1,
   wherein the wright-voltage supply circuit comprises:
      first to seventh input ports;
      first to third output ports;
      a logic circuit including first to fourth input terminals connected to the first to fourth input ports, a first output terminal to which a logical addition result of a first signal supplied from the first input port and a second signal supplied from the second input port is supplied, a second output terminal to which a logical addition result of the second signal and a third signal supplied from the third input port is supplied, a third output terminal to which a logical addition result of the first signal and a fourth signal supplied from the fourth input port is supplied, and a fourth output terminal to which a logical addition result of the third signal and the fourth signal is supplied;

a first level shift circuit including the first input terminal connected to the first output terminal of the logic circuit, the second input terminal connected to the second output terminal of the logic circuit, the third input terminal connected to the fifth input port, and an output terminal connected to the first output port;

a second level shift circuit including the first input terminal connected to the third output terminal of the logic circuit, the second input terminal connected to the fourth output terminal of the logic circuit, the third input terminal connected to the fifth input port, and an output terminal connected to the second output port; and a third level shift circuit including the first input terminal connected to the sixth input port, the second input terminal connected to the seventh input port, the third input terminal connected to the fifth input port, and an output terminal connected to the third output port.

5. A semiconductor storage apparatus, comprising:
a wright-voltage switching circuit;
a memory array;
a wright-voltage supply circuit connected to the memory array through the wright-voltage switching circuit;
a bit line discharge circuit; and
a bit line discharge control circuit connected to the memory array through the bit line discharge circuit,
wherein the wright-voltage supply circuit comprises a wright-voltage input port, a first erase cycle control signal input port, a second erase cycle control signal input port, a first wright-cycle control signal input port, a second wright-cycle control signal input port, an odd sense line test signal input port, an even sense line test signal input port, an odd sense line wright-voltage output port, an even sense line wright-voltage output port, a bit line wright-voltage output port, first to fourth OR circuits, and first to third level shift circuits, wherein the wright-voltage input port is each connected to the first to third level shift circuits, the first OR circuit is connected to the first erase cycle control signal input port, the odd sense line test signal input port, and the first level shift circuit, the second OR circuit is connected to the second erase cycle control signal input port, the odd sense line test signal input port, and the first level shift circuit, the third OR circuit is connected to the first erase cycle control signal input port, the even sense line test signal input port, and the second level shift circuit, the fourth OR circuit is connected to the second erase cycle control signal input port, the even sense line test signal input port, and the second level shift circuit, the odd sense line wright-voltage output port is connected to the first level shift circuit, the even sense line wright-voltage output port is connected to the second level shift circuit, and the bit line wright-voltage output port is connected to the third level shift circuit.

6. A semiconductor storage apparatus, comprising:
a wright-voltage switching circuit;
a memory array;
a wright-voltage supply circuit connected to the memory array through the wright-voltage switching circuit;
a bit line discharge circuit; and
a bit line discharge control circuit connected to the memory array through the bit line discharge circuit,
wherein the wright-voltage supply circuit comprises:
first to seventh input ports;
first to third output ports;
a logic circuit including first to fourth input terminals connected to the first to fourth input ports, a first output terminal to which a logical addition result of a first signal supplied from the first input port and a second signal supplied from the second input port is supplied, a second output terminal to which a logical addition result of the second signal and a third signal supplied from the third input port is supplied, a third output terminal to which a logical addition result of the first signal and a fourth signal supplied from the fourth input port is supplied, and a fourth output terminal to which a logical addition result of the third signal and the fourth signal is supplied;

a first level shift circuit including the first input terminal connected to the first output terminal of the logic circuit, the second input terminal connected to the second output terminal of the logic circuit, the third input terminal connected to the fifth input port, and an output terminal connected to the first output port;

a second level shift circuit including the first input terminal connected to the third output terminal of the logic circuit, the second input terminal connected to the fourth output terminal of the logic circuit, the third input terminal connected to the fifth input port, and an output terminal connected to the second output port; and a third level shift circuit including the first input terminal connected to the sixth input port, the second input terminal connected to the seventh input port, the third input terminal connected to the fifth input port, and an output terminal connected to the third output port.

* * * * *